(12) United States Patent
Shinohara (10) Patent No.: US 10,513,635 B2
(45) Date of Patent: Dec. 24, 2019

(54) ANISOTROPIC CONDUCTIVE FILM (71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/515,309

(22) PCT Filed: Oct. 26, 2015

(86) PCT No.: PCT/JP2015/080127
§ 371 (c)(1),
(2) Date: Mar. 29, 2017

(87) PCT Pub. No.: WO2016/068083
PCT Pub. Date: May 6, 2016

(65) Prior Publication Data
US 2017/0226387 A1    Aug. 10, 2017

(30) Foreign Application Priority Data

Oct. 31, 2014  (JP) .................................. 2014-223831

(51) Int. Cl.
*H01L 23/00* (2006.01)
*C09J 9/02* (2006.01)
(Continued)

(52) U.S. Cl.
CPC . *C09J 9/02* (2013.01); *C09J 7/00* (2013.01); *C09J 7/10* (2018.01); *H01B 1/12* (2013.01);
(Continued)

(58) Field of Classification Search
CPC ............... C09J 7/02; H01B 5/16; H01L 23/00
(Continued)

(56) References Cited

FOREIGN PATENT DOCUMENTS

JP    2003-286457    * 10/2003 ................ C09J 7/02
JP    2003-286457 A   10/2003
(Continued)

OTHER PUBLICATIONS

Jan. 12, 2016 International Search Report issued in Patent Application No. PCT/JP2015/080127.
(Continued)

*Primary Examiner* — Khanh T Nguyen
(74) *Attorney, Agent, or Firm* — Oliff PLC (57) ABSTRACT

An anisotropic conductive film with a structure wherein an electrically insulating adhesive base layer and cover layer are stacked, and electrically conductive particles are disposed at lattice points with a planar lattice pattern in the vicinity of the interface of the layers. In the anisotropic conductive film, a proportion of lattice points at which no electrically conductive particles are disposed with respect to all lattice points with the planar lattice pattern assumed in any reference region is 25% or less, and some of the electrically conductive particles disposed at lattice points with planar lattice pattern are disposed to be shifted in longitudinal direction of anisotropic conductive film with respect to corresponding lattice points, and a shift amount defined as a distance between a plane projection center of the electrically conductive particles disposed to be shifted and the corresponding lattice point is less than 50% the electrically conductive particles' average diameter.

16 Claims, 3 Drawing Sheets

(51) Int. Cl.
  *C09J 7/00* (2018.01)
  *H01B 1/12* (2006.01)
  *H01B 1/20* (2006.01)
  *C09J 7/10* (2018.01)
  *C08K 9/02* (2006.01)
  *H01L 23/498* (2006.01)

(52) U.S. Cl.
  CPC ............... *H01B 1/20* (2013.01); *H01L 24/27* (2013.01); *H01L 24/29* (2013.01); *C08K 9/02* (2013.01); *C08K 2201/001* (2013.01); *C09J 2201/36* (2013.01); *C09J 2201/606* (2013.01); *C09J 2203/326* (2013.01); *C09J 2205/102* (2013.01); *C09J 2433/00* (2013.01); *C09J 2463/00* (2013.01); *C09J 2499/00* (2013.01); *H01L 23/49827* (2013.01); *H01L 24/32* (2013.01); *H01L 2224/13144* (2013.01); *H01L 2224/27003* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29455* (2013.01); *H01L 2224/32225* (2013.01); *H01L 2224/83203* (2013.01); *H01L 2224/83851* (2013.01); *H01L 2924/14* (2013.01)

(58) Field of Classification Search
  USPC .......................................... 252/500; 428/343
  See application file for complete search history.

(56) References Cited

FOREIGN PATENT DOCUMENTS

| | | |
|---|---|---|
| JP | 2005-19274 A | 1/2005 |
| JP | 2010-033793 A | 2/2010 |
| JP | 2014-044946 A | 3/2014 |
| WO | 2005/054388 A1 | 6/2005 |

OTHER PUBLICATIONS

Jan. 12, 2016 Written Opinion issued in Patent Application No. PCT/JP2015/080127.
Nov. 9, 2016 International Preliminary Report on Patentability issued in International Patent Application No. PCT/JP2015/080127.
Sep. 3, 2018 Office Action issued in Chinese Patent Application No. 201580055668.9.
Apr. 10, 2019 Office Action issued in Chinese Patent Application No. 201580055668.9.
Jun. 10, 2019 Office Action issued in Japanese Patent Application No. 2015-209697.

\* cited by examiner

ANISOTROPIC CONDUCTIVE FILM

TECHNICAL FIELD

The present invention relates to an anisotropic conductive film.

BACKGROUND ART

An anisotropic conductive film in which electrically conductive particles are dispersed in an resin binder is widely used when an electrical component such as an IC chip is mounted on a wiring board and the like, but in such an anisotropic conductive film, it is known that electrically conductive particles are present in a state in which they are connected to or aggregated with each other. Therefore, in a case where the anisotropic conductive film is applied to connect an IC chip terminal and a wiring board terminal, the pitches of which are narrowed with light weight and miniaturization of an electronic device, a short circuit may be generated between the adjacent terminals due to the electrically conductive particles that are present in a state in which the electrically conductive particles are connected to or aggregated in the anisotropic conductive film.

In the related art, a film in which the electrically conductive particles are regularly arranged is suggested as an anisotropic conductive film to deal with such a narrow pitch. For example, Patent Document 1 suggests an anisotropic conductive film in which after an adhesive layer is formed in a stretchable film and the electrically conductive particles are densely packed in a single layer on a surface of the adhesive layer, the electrically conductive particles are regularly arranged by the film being biaxially stretched until the distance between the electrically conductive particles reaches the desired distance, then the electrically conductive particles are transferred to an electrically insulating adhesive base layer by pressing the electrically insulating adhesive base layer against the electrically conductive particles, the electrically insulating adhesive base layer being an element of the anisotropic conductive film. Patent Document 2 also suggests an anisotropic conductive film in which electrically conductive particles are dispersed on a transfer-type concave portion formation surface having a concave portion on a surface, the concave portion formation surface is squeegeed and the electrically conductive particles are held in the concave portion, the electrically conductive particles are primarily transferred to the adhesive layer by pressing therefrom an adhesive film on which an adhesive layer for transfer is formed, next, the electrically conductive particles are transferred to an electrically insulating adhesive base layer by pressing the electrically insulating adhesive base layer against the electrically conductive particles adhered to the adhesive layer, the electrically insulating adhesive base layer being an element of the anisotropic conductive film. In general, in these anisotropic conductive films, an electrically insulating adhesive cover layer is stacked to cover the electrically conductive particles on the surface of the electrically conductive particle side.

CITATION LIST

Patent Literature

Patent Document 1: WO/2005/054388
Patent Document 2: Japanese Unexamined Patent Application Publication No. 2010-033793A

SUMMARY OF INVENTION

Technical Problem

However, for ease of aggregation and secondary particleization of electrically conductive particles by static electricity and the like, it is difficult for electrically conductive particles to be usually singly present as primary particles. Therefore, problems arise as below in the arts of Patent Document 1 and Patent Document 2. That is, in the case of Patent Document 1, there is a problem in that it is difficult to densely pack the electrically conductive particles on the entire surface of the stretchable film in a single layer with no defects, the electrically conductive particles are packed in the stretchable film in a state in which the electrically conductive particles are aggregated causing a short, and a region is generated in which the electrically conductive particles are not packed (so-called "non-presence") causing conduction failure. In the case of Patent Document 2, there is a problem in that when the transfer-type concave portion is covered by electrically conductive particles with large particle diameter, thereafter the electrically conductive particles are removed by a squeegee, a concave portion that does not hold the electrically conductive particles is generated, and "non-presence" of the electrically conductive particles is generated in the anisotropic conductive film causing conduction failure, and conversely, when small electrically conductive particles are disposed in the concave portion and transferred to the electrically insulating adhesive base layer, positional shift occurs as a result of not overlapping of a position at which the electrically conductive particles are to be arranged and the center of the electrically conductive particles that are actually arranged, as a result, the regular arrangement is impaired, causing shorts or conduction failure.

As seen above, in Patent Documents 1 and 2, it is a fact that the manner, in which the "non-presence" and "arrangement shift" of the electrically conductive particles to be arranged with a regular pattern on the anisotropic conductive film, are to be controlled is not sufficiently considered.

The object of the present invention is to solve problems of the related arts described above and provide an anisotropic conductive film in which generation of shorts or conduction failure is largely suppressed from the viewpoints of the "non-presence" and "arrangement shift" of the conductive particles to be arranged with a regular pattern.

Solution to Problem

The present inventor has discovered that it is possible to achieve the object described above by controlling "a proportion of lattice points at which no electrically conductive particles are disposed" with respect to all lattice points with a planar lattice pattern assumed any reference region of the anisotropic conductive film and "arrangement shift of the electrically conductive particles with respect to lattice points" when electrically conductive particles are disposed at lattice points with a plane lattice, and the present invention was completed. The present inventor also has discovered that it is possible to manufacture such an anisotropic conductive film not by disposing electrically conductive particles on the concave portion of a transfer body but by adhering and transferring electrically conductive particles to a tip end of a columnar convex portion of the transfer body in which the convex portion is formed on the surface, and a manufacturing method of the present invention was completed.

Accordingly, the present invention provides an anisotropic conductive film with a structure in which an electrically insulating adhesive base layer and an electrically insulating adhesive cover layer are stacked, and electrically conductive particles are disposed at lattice points with a planar lattice pattern in the vicinity of an interface of the layers.

In the anisotropic conductive film, a proportion of the lattice points at which no electrically conductive particles are disposed with respect to all lattice points with the planar lattice pattern assumed in any reference region of the anisotropic conductive film is 25% or less, and some of the electrically conductive particles disposed at the lattice points with the planar lattice pattern are disposed to be shifted in a longitudinal direction of the anisotropic conductive film with respect to corresponding lattice points, and a shift amount defined as a distance between a plane projection center of the electrically conductive particles disposed to be shifted and the corresponding lattice point is less than 50% of an average particle diameter of the electrically conductive particles.

The present invention also provides a method for manufacturing the anisotropic conductive film described above. The method includes the following steps (i) to (v):

step (i)

preparing a transfer body in which a columnar convex portion equivalent to lattice points of a planar lattice pattern is formed on a surface;

step (ii)

setting at least a top surface of a convex portion of the transfer body as a weak adhesive layer;

step (iii)

adhering electrically conductive particles to the weak adhesive layer of the convex portion of the transfer body;

step (iv)

transferring the electrically conductive particles to an electrically insulating adhesive base layer by overlapping and pressing the electrically insulating adhesive base layer on a surface on a side of the transfer body at which the electrically conductive particles are adhered; and step (v)

stacking an electrically insulating adhesive cover layer on the adhesive base layer, on which the electrically conductive particles are transferred, from an electrically conductive particle transfer surface side.

The present invention further provides a connection structure in which a terminal of a first electrical component and a terminal of a second electrical component are anisotropic-eletroconductively connected using the anisotropic conductive film of the present invention.

Advantageous Effects of Invention

In an anisotropic conductive film of the present invention, a proportion of "lattice points at which no electrically conductive particles are disposed" with respect to all lattice points with the planar lattice pattern assumed in any reference region is set to 25% or less, and moreover, some of the electrically conductive particles disposed at the lattice points with the planar lattice pattern are disposed to be shifted in a longitudinal direction of the anisotropic conductive film with respect to corresponding lattice points, and the "shift amount of the electrically conductive particles" defined as a distance between the center of the electrically conductive particles disposed to be shifted and the corresponding lattice point is set to be less than 50% of an average particle diameter of the electrically conductive particles. A shift in the longitudinal direction is a shift in one direction of the longitudinal direction. Therefore, in a case where the anisotropic conductive film of the present invention is applied to anisotropic conductive connection, it is possible to realize a good initial conduction resistance value and good conduction reliability after aging, and it is also possible to suppress generation of shorts.

In a method for manufacturing the anisotropic conductive film of the present invention, a transfer body, in which a columnar convex portion equivalent to lattice points with a planar lattice pattern is formed on a surface is used, electrically conductive particles are adhered to a weak adhesive layer formed on a top surface of the convex portion, and then the electrically conductive particles are transferred to an electrically insulating adhesive base layer. Therefore, in a case where a proportion of "lattice points at which no electrically conductive particles are disposed" with respect to all lattice points with the planar lattice pattern assumed in any reference region of the anisotropic conductive film is 25% or less, and when some of the electrically conductive particles disposed at the lattice points with the planar lattice pattern are disposed to be shifted in a longitudinal direction of the anisotropic conductive film with respect to corresponding lattice points, it is possible for a "shift amount of the electrically conductive particles" defined as a distance between a center of the electrically conductive particles disposed to be shifted and the corresponding lattice point to be less than 50% of an average particle diameter of the electrically conductive particles. Consequently, if the anisotropic conductive film obtained by the manufacturing method of the present invention is used, then it is possible to anisotropic-conductively connect an IC chip and a wiring board with narrow pitches while largely suppressing generation of shorts and conduction failure.

DESCRIPTION OF EMBODIMENTS

An anisotropic conductive film of the present invention will be described below in detail with reference to the drawings.

Anisotropic Conductive Film

Figure 1:
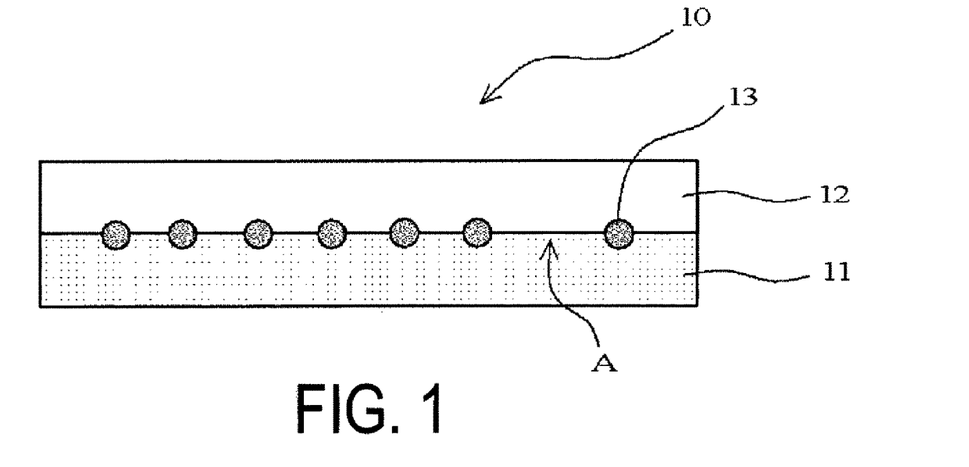
FIG. 1 is a cross-sectional view of an anisotropic conductive film of the present invention.
Figure 2:
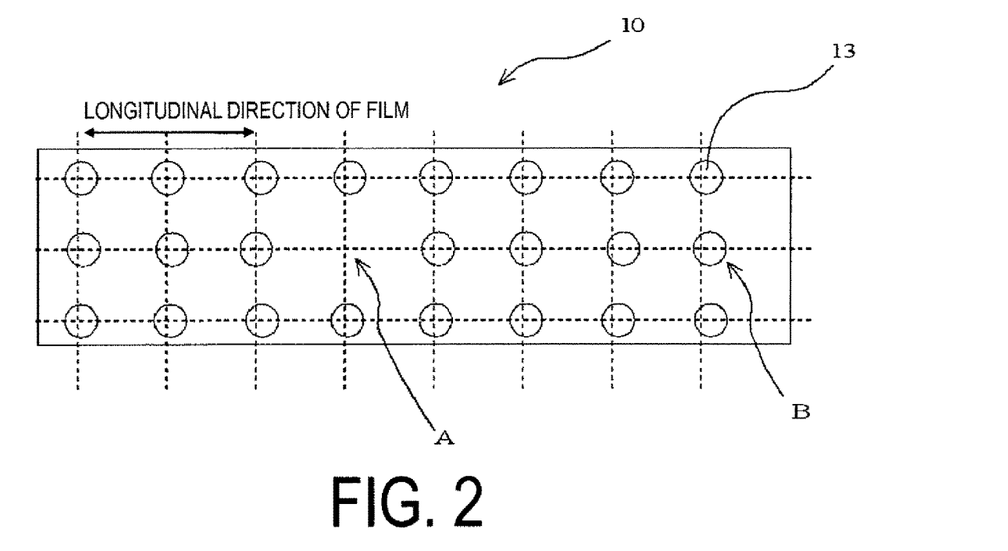
FIG. 2 is a perspective plan view of the anisotropic conductive film of the present invention.

As illustrated in FIG. 1 (cross-sectional view) and FIG. 2 (perspective plan view), an anisotropic conductive film 10 of the present invention has a structure in which an electrically insulating adhesive base layer 11 and an electrically insulating adhesive cover layer 12 are stacked, and in the vicinity of an interface thereof, electrically conductive particles 13 are disposed at lattice points with a planar lattice pattern (dotted line in FIG. 2). In FIGS. 1 and 2, the planar lattice pattern is assumed to be along a longitudinal direction of the anisotropic conductive film 10 and a direction (transverse direction) that is orthogonal to the longitudinal direction, but the entire pattern may be assumed to be inclined with respect to both of the longitudinal direction and the transverse direction. Here, an arrow A indicates a position at which no electrically conductive particles are disposed at lattice points with the planar lattice, and a so-called position at which there is "non-presence" of the electrically conductive particles. An arrow B indicates the electrically conductive particles disposed to be shifted from the corresponding lattice points in the longitudinal direction of the anisotropic conductive film. Here, a shift amount defined as a distance between the center of the electrically conductive particle disposed to be shifted (in detail, the center of gravity of a shadow projected on a plane of the electrically conductive particles) and the corresponding lattice point is less than 50% of an average particle diameter of the electrically conductive particles considering regular arrangement. Note that the shift is caused by a manufacturing method, and is generated only in the longitudinal direction of the film. An effect occurs in which it is easy to capture the electrically conductive particles in a bump during anisotropic conductive connection because of the shift of the electrically conductive particles in a predetermined range. Even if the electrically conductive particles are applied to an end of the bump in a width direction of the bump (which is a direction orthogonal to the longitudinal direction of the film), the electrically conductive particles moderately disperse. Therefore if external tangents of the electrically conductive particles are disposed in series along the lattice points, that is, in a direction substantially perpendicular to the longitudinal direction of the film so as not to coincide rather than to coincide, then it is possible to expect an effect in which some particles are easily captured and the captured number is stabilized. The effect is particularly exhibited in the case of a fine pitch.

Note that it is preferable that a maximum value of the shift amount of the electrically conductive particles disposed to be shifted from the lattice points in the longitudinal direction of the anisotropic conductive film is larger than the shift amount in the direction orthogonal to the longitudinal direction.

In addition, the proportion of lattice points at which the electrically conductive particles are disposed to be shifted in the longitudinal direction of the anisotropic conductive film with respect to all lattice points at which the electrically conductive particles are disposed is preferably 90% or greater from the perspective of connection stability. In other words, the number of electrically conductive particles that are close at a distance of less than 50% particle diameter is 10% or less of the number of electrically conductive particles. For example, in the case of FIG. 2, the shift comes close to one direction (right side) in the longitudinal direction. It is possible to maintain an arrangement distance of one or more times the particle diameter as a whole since 90% or greater comes close to the one direction. Accordingly, the number of the particles that are close is 10% or less of the total number. Consequently, a lattice shape is maintained since substantially all electrically conductive particles are shifted in the predetermined range in the one direction, and there is no aggregation causing a short. As seen above, a tendency indicates that regularity along a longitudinal direction of the film is higher than regularity along a direction orthogonal to the longitudinal direction of the film.

This means that, for example, in the case of FIG. 2, there is a tendency for the electrically conductive particles to align on a straight line in the longitudinal direction of the film, and there is a tendency to be easily removed from on the straight line in the direction orthogonal to the longitudinal direction. Described in further detail, conductive particles in a planar direction of the film being generally shifted in one longitudinal direction of the film means that it is observed that center points of the particles are mainly shifted to the longitudinal direction side of the film, with respect to the lattice points in the arrangement, and the center points meanders in a direction orthogonal to the longitudinal direction of the film.

"Non-Presence" of Electrically Conductive Particle

In the anisotropic conductive film of the present invention, the proportion of "lattice points in which no electrically conductive particles are disposed" (A in FIG. 2) (proportion of lattice points at which electrically conductive particles are not present) with respect to all lattice points with the planar lattice pattern assumed in any reference region of the anisotropic conductive film is set to 25% or less and preferably to 10 to 25%. Thereby, in a case where the anisotropic conductive film of the present invention is applied to anisotropic conductive connection, it is possible to achieve good initial conduction resistance and good conduction reliability after aging, and it is also possible to suppress generation of shorts.

Note that the lattice points at which the electrically conductive particles are "not present" not being continuous in the planar direction of the anisotropic conductive film is preferable from the viewpoints of initial conduction resistance and conduction reliability, but in practical use, nine or more lattice points at which the electrically conductive particles are "not present" may not be continuous.

Planar Lattice Pattern

Examples of the planar lattice pattern include a rhombic lattice, a hexagonal lattice, a square lattice, a rectangular lattice, and a parallel lattice. Therein, the hexagonal lattice in which closest packing is possible is preferable.

Here, it is possible to select the whole surface of the anisotropic conductive film as the reference region of the anisotropic conductive film, but ordinarily, it is preferable to select, as the reference region, a substantially square region including a side X and a side Y that satisfy the following relationship (A) of the plane center portion of the anisotropic conductive film, and preferably satisfy the following relationships (1), (2), and (3).

$$100\ D \leq X+Y \leq 400\ D \tag{A}$$

$$X+Y=100\ D \tag{1}$$

$$X \geq 5\ D \tag{2}$$

$$Y \geq 5\ D \tag{3}$$

Note that in a case of applying the film to FOG connection in which a connection area is comparatively large, it is possible to reduce the amount of electrically conductive particles being present in the film, in such a case, as shown below, it is preferable to respectively increase the values of X and Y preferably to 20 D or greater, and it is preferable to set a numerical value of "X+Y" to numerical value from 100 D to in the vicinity of 400 D and finally to 400 D.

$$X+Y=400\ D$$

$$X \geq 20\ D$$

$$Y \geq 20\ D$$

In relationships (A) and (1) to (3), D is an average particle diameter of the electrically conductive particles. It is possible to measure the average particle diameter of the electrically conductive particles using an image-type particle size analyzer. In addition, the side Y is a straight line in a range of less than ±45° with respect to the longitudinal direction (refer to FIG. 2) of the anisotropic conductive film, and the side X is a straight line perpendicular to the side Y.

It is possible to cause the reference region to resemble or approximate a shape of a bump to which the electrically conductive particles are pressed by defining the reference region in this manner, as a result, it is possible to increase the permissible range of shift from the planar lattice pattern of the electrically conductive particles, and anisotropic conductive connection is economically and stably performed. In other words, it is possible to reliably perform anisotropic conductive connection since, even if the electrically conductive particles positionally shift, are non-present, or are close in a range assumed to be in a range in which the smallest side of the reference region is set to five times or more of the electrically conductive particle diameter, the electrically conductive particles are captured by any bump and there is no excessive aggregation in a space between bumps.

Note that the reason that the smallest side is five times or greater of the electrically conductive particle diameter is because it is necessary for the side to be typically larger than the average particle diameter of the electrically conductive particles for reliably capturing the particles in at least one side of the bump that is subjected to anisotropic conductive connection, and moreover, it is necessary to desirably provide a diameter two times or greater the average particle diameter of the electrically conductive particles for a space between bumps because of short prevention. In other words, the reason is because when focusing on circular electrically conductive particles as one reference, if an unexpected failure is not generated in a concentric circle with a diameter with a length (that is, 5 D) four times the diameter of the average particle diameter D (4 D) of the electrically conductive particles added to the average particle diameter D, then it is considered that the requirements described above can be satisfied. In addition, the reason is because a minimum distance between bumps in a case of a fine pitch is less than four times the electrically conductive particle diameter, as an example.

Disposition of Electrically Conductive Particles

Preferably six or more electrically conductive particles are disposed continuously, and more preferably eight or more electrically conductive particles are disposed continuously in a direction orthogonal to the longitudinal direction of the film. This is because, when there is an absence of electrically conductive particles in the longitudinal direction of the bump, there is a concern that there is a failure to anisotropic conductive connection. In this case, it is preferable to satisfy the condition above in three out of seven rows continuous along the longitudinal direction of the film, and it is more preferable to satisfy the condition above in five out of seven rows. Thereby, it is possible to set an electrically conductive particle number captured by the bump to certain number or more, and it is possible to stably perform anisotropic conductive connection.

In addition, it is preferable that four or more continuous absent electrically conductive particles in the longitudinal direction of the film and four or more continuous absent electrically conductive particles in the direction orthogonal to the longitudinal direction of the film do not intersect, it is more preferable that any of the four or more continuous absences are not adjacent via one or more electrically conductive particles being lattice points, and it is even more preferable that any of the four or more continuous absences are not adjacent via two or more electrically conductive particles being lattice points. Such an intersection of absences is not a problem even if up to three rows intersect simultaneously with absences in one longitudinal direction. This is because when there is no more absence, the electrically conductive particles in the vicinity thereof are captured by a bump.

The absence of the electrically conductive particles in the film longitudinal direction is not a problem in practical use if within a total of 12 in 50 of any continuous lattice points. When there is no absence in any row adjacent to a continuous absent row, counting may even be carried out from the middle of the absence.

Particle Area Occupancy

In addition, it is effective for particle area occupancy of all electrically conductive particles that are present in the area of any reference region of the anisotropic conductive film with respect to the area of the reference region of the anisotropic conductive film to ordinarily be 0.15% or greater, preferably 0.35% or greater, and more preferably 1.4% or greater in a case where a bump size or a distance between bumps is relatively large in the manner of FOG connection. An upper limit in this case is preferably 35% or less and is more preferably 32% or less. In a case where the bump size or the distance between bumps is relatively small (for example, COG connection), the upper limit is ever more preferably 10 to 35%, and particularly preferably 14 to 32%. When in this range, even in a case where the anisotropic conductive film of the present invention is applied to anisotropic conductive connection, it is possible to achieve better initial conduction and conduction reliability after aging, and it is also possible to further suppress generation of shorts. Here, the particle area occupancy is a proportion of an area that all electrically conductive particles occupy which are present in any reference region with respect to an area S of the reference region. The area that all electrically conductive particles occupy is represented by $(R/2)^2 \times \pi \times n$ wherein R is the average particle diameter of the electrically conductive particles and n is the number of electrically conductive particles. Accordingly, the following equation is established: particle area occupancy (%)=$[\{(R/2)^2 \times \pi \times n\}/S] \times 100$.

Accordingly, the calculated particle area occupancy is 0.157% in a case where the average particle diameter of the electrically conductive particles is 2 μm, a number density is 500/mm² (0.0005/μm²), X=Y=200 D, and X+Y=400 D. The calculated particle area occupancy is 0.35325% in a case where the average particle diameter of the electrically conductive particles is 3 μm, the number density is 500/mm² (0.0005/μ²), X=Y=200 D, and X+Y=400 D. The calculated particle area occupancy is 1.413% in a case where the average particle diameter of the electrically conductive particles is 3 μm, the number density is 2000/mm² (0.002/μ²), X=Y=200 D, and X+Y=400 D. In addition, the calculated particle area occupancy is 35.325% in a case where the average particle diameter of the electrically conductive particles is 30 μm, the number density is 500/mm² (0.0005/μ²), X=Y=200 D, and X+Y=400 D.

Electrically Conductive Particles

It is possible to appropriately select and use one from electrically conductive particles used in a known anisotropic conductive film. Examples of the electrically conductive particles include metal particles such as nickel, copper, silver, gold, and palladium and metal-coated resin particles with the surface of resin particles such as polyamide and polybenzoguanamine coated with metal such as nickel. In addition, from the viewpoint of handling during manufacture, the average particle diameter of the electrically conductive particles is preferably 1 to 30 μm, more preferably 1 to 10 μm, and particularly preferably 2 to 6 μm. As described above, it is possible to measure the average particle diameter of the electrically conductive particles using the image-type particle size analyzer.

The amount of presence of the electrically conductive particles in the anisotropic conductive film depends on the lattice pitch with the planar lattice pattern and the average particle diameter of the electrically conductive particles, and ordinarily is 300 to 40000/mm².

Distance Between Adjacent Lattice Points

The distance between adjacent lattice points in the planar lattice pattern that is assumed for the anisotropic conductive film is preferably 0.5 times or greater, more preferably 1 time or greater, even more preferably from 1 time or greater to 20 times or less the average particle diameter of the electrically conductive particles. When the distance is in this range, even in a case where the anisotropic conductive film of the present invention is applied to anisotropic conductive connection, it is possible to achieve better initial conduction and conduction reliability after aging, and it is also possible to further suppress generation of shorts.

Electrically Insulating Adhesive Base Layer

It is possible to appropriately select and use one from electrically insulating adhesive base layers used in a known anisotropic conductive film as the electrically insulating adhesive base layer 11. For example, it is possible to use a photoradical polymerizable resin layer including an acrylate compound and photoradical polymerization initiator, a thermal radical polymerizable resin layer including an acrylate compound and a thermal radical polymerization initiator, a thermal cationic polymerizable resin layer including an epoxy compound and a thermal cationic polymerization initiator, a thermal anionic polymerizable resin layer including an epoxy compound and a thermal anionic polymerization initiator, and the like, or a curable resin layer thereof. In addition, it is possible to appropriately select and contain a silane coupling agent, a pigment, an antioxidant, an ultraviolet absorber, and the like in the resin layers as appropriate.

Note that the electrically insulating adhesive base layer 11 can be formed by depositing a film using a coating method and drying, and further curing, a coating composition including the resin as described above, or otherwise by forming the coating composition into a film using a method known in advance.

The thickness of such an electrically insulating adhesive base layer 11 is preferably 1 to 30 μm and more preferably 2 to 15 μm.

Electrically Insulating Adhesive Cover Layer

It is possible to appropriately select and use one from electrically insulating adhesive cover layers used in a known anisotropic conductive film as the electrically insulating adhesive cover layer 12. In addition, it is possible to use one formed from the same material as the electrically insulating adhesive base layer 11 as described earlier.

Note that the electrically insulating adhesive cover layer 12 can be formed by depositing a film using a coating method and drying, and further curing, a coating composition including the resin as described above, or otherwise by forming the coating composition into a film using a method known in advance.

The thickness of such an electrically insulating adhesive cover layer 12 is preferably 1 to 30 μm and more preferably 2 to 15 μm.

Furthermore, an electrically insulating filler such as silica fine particles, alumina, and aluminum hydroxide may be added to the electrically insulating adhesive base layer 11 or the electrically insulating adhesive cover layer 12 as necessary. The blending amount of the electrically insulating filler is preferably 3 to 40 parts by mass per 100 parts by mass of resin included in the layers. Thereby, even if an electrically insulating adhesive layer 10 is melted during anisotropic conductive connection, it is possible to prevent the electrically conductive particles 13 from moving unnecessarily by the melted resin.

Stacking of Electrically Insulating Adhesive Base Layer and Electrically Insulating Adhesive Cover Layer Note that in a case where the electrically insulating adhesive base layer 11 and the electrically insulating adhesive cover layer 12 are stacked interposing the electrically conductive particles 13, it is possible to perform the process using a known method. In this case, the electrically conductive particles 13 are present in the vicinity of the interface of the layers. Here, "present in the vicinity of the interface" indicates that some of the electrically conductive particles bite into one layer, the remainder bites into another layer.

Manufacture of Anisotropic Conductive Film

Next, a method for manufacturing the anisotropic conductive film according to the present invention is described that has a structure in which the electrically insulating adhesive base layer and the electrically insulating adhesive cover layer are stacked, and in the vicinity of the interface thereof, electrically conductive particles are disposed in lattice points with a planar lattice pattern. The manufacturing method has the following steps (i) to (v). Each step will be described in detail with reference to the drawings.

Step (i)

Figure 3A:
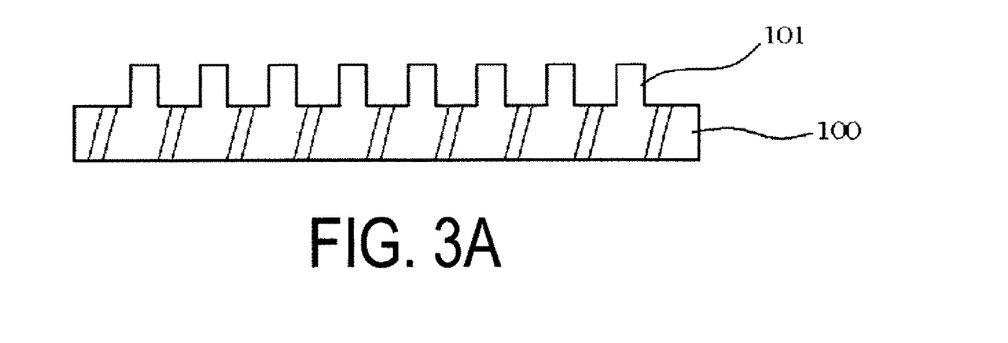
FIG. 3A is a step explanatory diagram of a manufacturing method of the present invention.

First, as illustrated in FIG. 3A, a transfer body 100 is prepared in which a columnar convex portion 101 equivalent to the lattice points with the planar lattice pattern is formed on the surface. Here, the columnar shape includes a cylindrical shape or prism shape (a triangular prism, a square prism, a hexagonal prism, and the like). The columnar shape is preferably the cylindrical shape. The height of the convex portion 101 can be determined depending on terminal pitch, terminal width, space width, the average particle diameter of the electrically conductive particles, and the like for subjecting to anisotropic conductive connection, but is preferably 2.5 times or greater to less than 5 times, and more preferably from 2.5 times or greater to 3.5 times or less the average particle diameter of the utilized electrically conductive particles. In addition, the width of the convex portion 101 (width at a half height) is preferably 0.6 times or greater to less than 1.3 times, and more preferably 0.6 times or greater to 1.1 times or less the average particle diameter of the electrically conductive particles. If the height and width are in this range, then an effect is obtained in which continuous generation of omission and non-presence are avoided.

Furthermore, the convex portion 101 has a substantially flat top surface of the level such that the electrically conductive particles are stably adhered.

Specific Example of Transfer Body

The transfer body to be prepared in step (i) can be created utilizing a known method. For example, the transfer body can be created by processing a metal plate to create a master, and then coating and curing a cured resin thereon. In detail, a transfer body master in which the concave portion corresponding to the convex portion is formed is also created by cutting and processing a flat metal plate, and then the transfer body is obtained by coating and curing a resin composition included in the transfer body on the concave portion formation surface of the master, and then pulling the resin composition away from the master.

Step (ii)

Figure 3B:
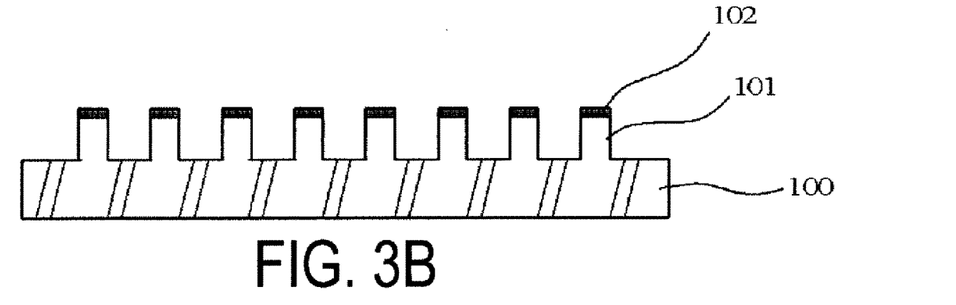
FIG. 3B is a step explanatory diagram of the manufacturing method of the present invention.

Next, as illustrated in FIG. 3B, at least the top surface of the convex portions 101 of the transfer body 100 in which a plurality of convex portions 101 are formed with the planar lattice pattern on the surface is set as a weak adhesive layer 102.

Weak Adhesive Layer of Transfer Body

The weak adhesive layer 102 is a layer indicating adhesive force that can temporarily hold the electrically conductive particles until the electrically conductive particles are transferred to the electrically insulating adhesive base layer included in the anisotropic conductive film, and is formed on at least the top surface of the convex portions 101. Accordingly, the entire convex portions 101 may be slightly adhesive. The thickness of the weak adhesive layer 102 can be appropriately determined depending on the material of the weak adhesive layer 102, the particle diameter of the electrically conductive particles, and the like. In addition, "weak adhesive" has a meaning of a weaker adhesive force than the electrically insulating adhesive base layer when the electrically conductive particles are transferred to the electrically insulating adhesive base layer.

Such a weak adhesive layer 102 can apply a weak adhesive layer used in a known anisotropic conductive film. For example, it is possible to form the weak adhesive layer by coating and drying a silicone-based adhesive composition and an adhesive layer of the same material as the electrically insulating adhesive base layer or the electrically insulating adhesive cover layer on a top surface of the convex portions 101.

Step (iii)

Figure 3C:
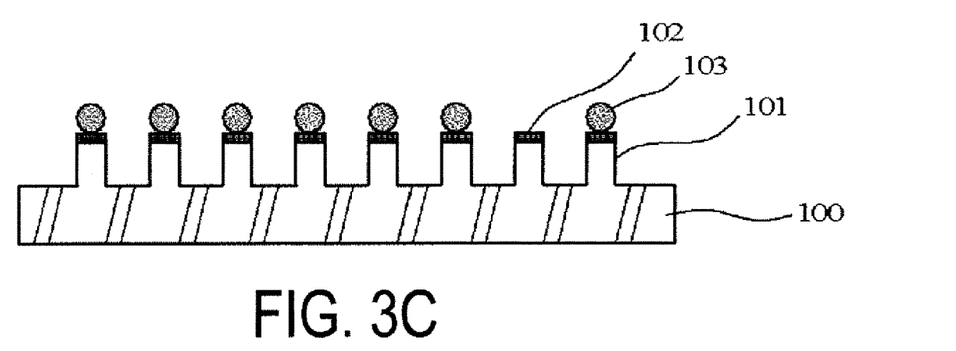
FIG. 3C is a step explanatory diagram of the manufacturing method of the present invention.

Next, as illustrated in FIG. 3C, the electrically conductive particles 103 are adhered to the weak adhesive layer 102 of the convex portions 101 of the transfer body 100. In detail, the electrically conductive particles 103 are dispersed from above the convex portions 101 of the transfer body 100, the electrically conductive particles 103 that are not adhered to the weak adhesive layer 102 may be blown away using a blower. In this case, in some of the convex portions 101, at a certain frequency, the electrically conductive particles are adhered by an action of static electricity and the like on the side surface, and moreover, some electrically conductive particles may not be removed by the blower.

In this way, when the electrically conductive particles are blown away by the blower, it is possible to control the amount of occurrence of "non-presence" of electrically conductive particles by changing the number of times of blowing. For example, when the number of times of blowing is increased, it is possible to increase "non-presence" of electrically conductive particles. When "non-presence" of electrically conductive particles is increased, as a result, it is possible to reduce the amount of use of the electrically conductive particles, and it is possible to reduce manufacturing costs of the anisotropic conductive film.

Note that the direction of the surface is reversed from FIG. 3C, and the top surface of the projection may be attached to a surface on which the electrically conductive particles are laid all over the surface. This results in that unnecessary stress is not applied to the electrically conductive particles. It is easy to recover and reuse the electrically conductive particles by adhering only electrically conductive particles necessary for the arrangement in this way on the projection top surface, and economic efficiency is excellent in comparison to a method for packing and taking out the electrically conductive particles in an opening. Note that in a case of the method for packing and taking out the electrically conductive particles in an opening, there is a concern that it is easy for unnecessary stress to be applied to the electrically conductive particles that are not packed.

Step (iv)

Figure 3D:
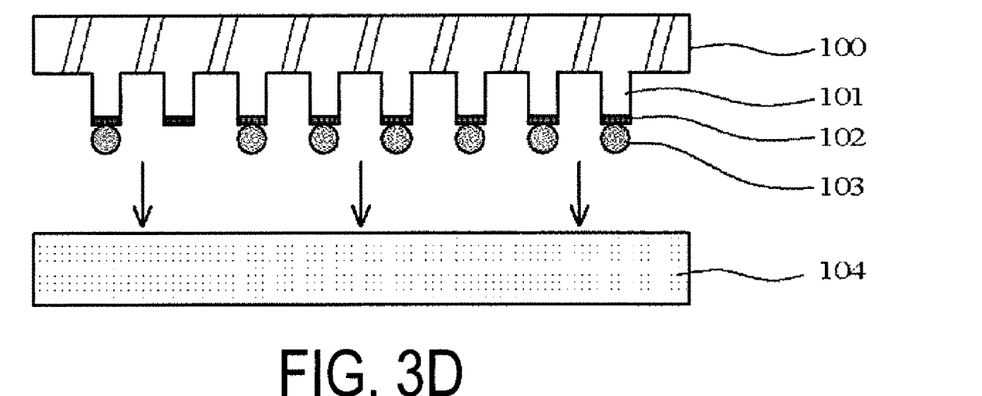
FIG. 3D is a step explanatory diagram of the manufacturing method of the present invention.
Figure 3E:
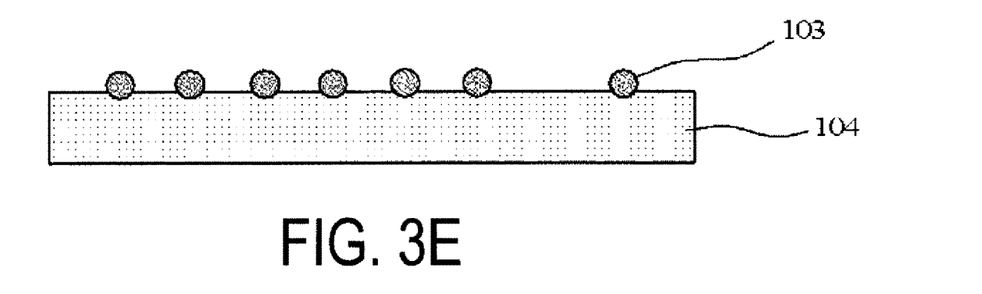
FIG. 3E is a step explanatory diagram of the manufacturing method of the present invention.

Next, as illustrated in FIG. 3D, the electrically conductive particles 103 are transferred to one side of the electrically insulating adhesive base layer 104 by overlapping and pressing the electrically insulating adhesive base layer 104 included in the anisotropic conductive film on the surface on a side of the transfer body 100 at which the electrically conductive particles 103 are adhered (FIG. 3E). In this case, preferably the transfer body 100 overlaps and presses the electrically insulating adhesive base layer 104 such that the convex portions 101 face downward. This is because the electrically conductive particles that are not stuck to the top surface of the convex portion are easily removed by being blown while facing down.

Step (v)

Figure 3F:
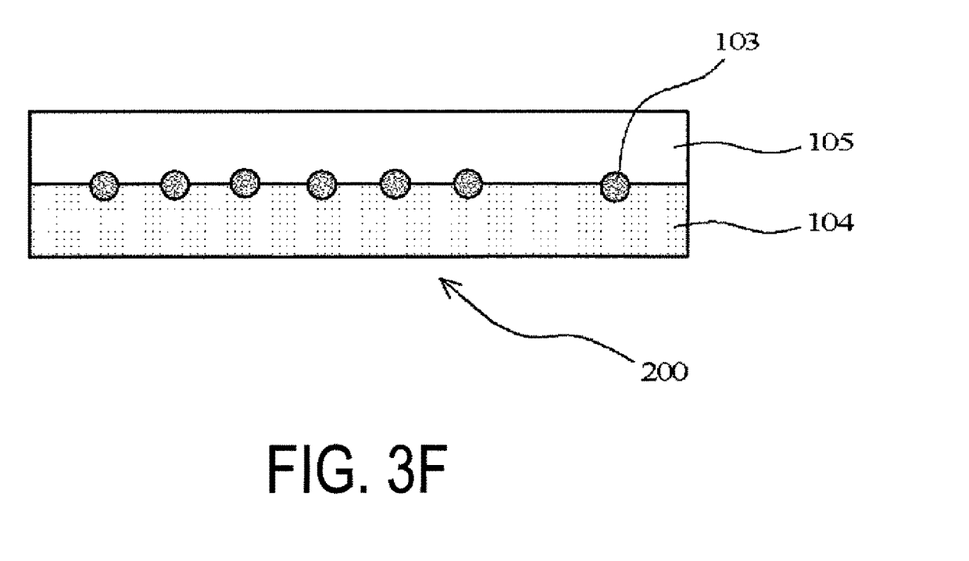
FIG. 3F is a step explanatory diagram of the manufacturing method of the present invention while being a schematic cross-sectional view of the anisotropic conductive film of the present invention.

As illustrated in FIG. 3F, the electrically insulating adhesive cover layer 105 is stacked from the electrically conductive particle transfer surface side to the electrically insulating adhesive base layer 104 on which the electrically conductive particles 103 are transferred. Thereby, an anisotropic conductive film 200 of the present invention is obtained.

Connection Structure

The anisotropic conductive film of the present invention can apply the connection structure of a so-called chip on glass (COG), film on glass (FOG), or the like in which a short or conduction failure is suppressed by disposing the film between a terminal (such as a bump) of a first electrical component (such as an IC chip) and a terminal (such as a bump or a pad) of a second electrical component (such as a wiring board) and finally curing the film using thermocompression bonding from the first or second electrical component side to perform anisotropic conductive connection.

EXAMPLES

Detailed description of the present invention is given below.

Example 1

A nickel plate with a thickness of 2 mm was prepared, a cylindrical shaped concave portion (with inner diameter 3 µm and depth 10 µm) was formed in a square lattice pattern, and the transfer body master was obtained. The distance between the centers of adjacent concave portions was 8 µm. Accordingly, the density of concave portions was 16000/mm$^2$.

The transfer body was created by coating a thermosetting resin composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of a cationic curing agent (SI-60L, Sanshin Chemical Industry Co., Ltd.) on the obtained transfer body master such that the dry thickness was 30 mm, and then heating the resultant for 5 minutes at 80° C.

The transfer body was obtained by peeling off the transfer body from the master, winding the transfer body on a stainless steel roll with a diameter of 20 cm such that the convex portions were external, causing an adhesive sheet obtained by impregnating a nonwoven fabric with a weak adhesive composition containing 70 parts by mass of epoxy resin (jER828, Mitsubishi Chemical Corporation) and 30 parts by mass of phenoxy resin (YP-50, Nippon Steel & Sumikin Chemical Co., Ltd.) to come into contact with the transfer body while rotating the roll, causing the weak adhesive composition to adhere to the top surface of the convex portions, and forming the weak adhesive layer with a thickness of 1 μm.

The electrically conductive particles, which were not adhered to the weak adhesive layer, were removed by blowing after the electrically conductive particles with average particle diameter of 4 μm (nickel plated resin particles (AUL704, Sekisui Chemical Co., Ltd.)) were dispersed on the surface of the transfer body.

The electrically conductive particles where transferred to the electrically insulating adhesive base layer by pressing the transfer body to which the electrically conductive particles are adhered at a temperature of 50° C. and with a pressure of 0.5 MPa with respect to a thermosetting type electrically insulating adhesive film with a sheet shape with a thickness of 5 μm that is the electrically insulating adhesive base layer (film formed from an electrically insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), 2 parts by mass of cationic curing agent (SI-60L, Sanshin Chemical Industry Co., Ltd.), and 20 parts by mass of silica fine particles (Aerosil RY200, Nippon Aerosil Co., Ltd.)) from the electrically conductive particle adhesion surface.

Another electrically insulating adhesive film with a sheet shape with a thickness of 15 μm (film formed from a thermosetting resin composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of cationic curing agent (SI-60L, Sanshin Chemical Industry Co., Ltd.)) as a transparent electrically insulating adhesive cover layer was superimposed on the electrically conductive particle transfer surface of the obtained electrically insulating adhesive base layer and stacked at a temperature of 60° C. and with a pressure of 2 MPa. Thereby, the anisotropic conductive film was obtained.

Example 2

In addition to setting the number of times that blowing was performed to remove the electrically conductive particles that were not adhered to the weak adhesive layer to three times that in Example 1, the anisotropic conductive film was obtained by repeating Example 1.

Example 3

In addition to setting the inner diameter of the concave portions of the transfer body master to 2 μm, setting the depth of the concave portions to 9 μm, setting the distance between the centers of adjacent concave portions to 6 μm, setting the density of the concave portions to 28000/mm², and using electrically conductive particles (AUL703, Sekisui Chemical Co., Ltd.) with an average particle diameter of 3 μm instead of electrically conductive particles with an average particle diameter of 4 μm, the anisotropic conductive film was obtained by repeating Example 1.

Example 4

In addition to setting the number of times that blowing was performed to remove the electrically conductive particles that were not adhered to the weak adhesive layer to three times that in Example 3, the anisotropic conductive film was obtained by repeating Example 3.

Comparative Example 1

In addition to setting the number of times that blowing was performed to remove the electrically conductive particles that were not adhered to the weak adhesive layer to ten times that in Example 1, the anisotropic conductive film was obtained by repeating Example 1.

Comparative Example 2

In addition to setting the number of times that blowing was performed to remove the electrically conductive particles that were not adhered to the weak adhesive layer to ten times that in Example 3, the anisotropic conductive film was obtained by repeating Example 3.

Evaluation

"Non-Presence" and "Shift Amount" of Electrically Conductive Particle

For the anisotropic conductive films of Examples 1 to 4 and Comparative Examples 1 and 2, a 1-cm-square region was observed using an optical microscope (MX50, Olympus Corporation) from the transparent electrically insulating adhesive cover layer side, and the proportion of the lattice points at which the electrically conductive particles were not adhered (non-presence [%]) was examined with respect to all lattice points in the assumed planar lattice pattern. The obtained result is shown in Table 1. In addition, a shift amount of the electrically conductive particles that are disposed in the lattice points with the assumed planar lattice pattern was measured from the lattice points. The obtained maximum value is shown in Table 1.

Note that, in addition to non-presence, no state in which there is significant interference with connection was observed.

Note that the direction of shift of the electrically conductive particles in the anisotropic conductive films of Examples 1 to 4 and Comparative Examples 1 and 2 was one longitudinal direction of the anisotropic conductive film. In addition, the proportion of the lattice points at which the electrically conductive particles were disposed to be shifted by less than 50% of the particle diameter in one longitudinal direction of the anisotropic conductive film with respect to all lattice points at which the electrically conductive particles were disposed, was 4% in the case of Example 1, was 10% in the case of Example 2, was 5% in the case of Example 3, was 10% in the case of Example 4, was 15% in the case of Comparative Example 1, and was 17% in the case of Comparative Example 2. In a case where the shift amount is large, it is difficult to provide the electrically conductive particles at predetermined positions, and it is easy for failure to be generated in the terminal.

Particle Area Occupancy

The particle area occupancy was calculated upon considering "non-presence" of the electrically conductive particles from the average particle diameter of the electrically conductive particles and concave portion density of the transfer body master (=convex portion density of the transfer body). The obtained result is shown in Table 1.

Initial Conduction Resistance

Anisotropic conductive connection was performed on the IC chip that has a gold bump with a height of 15 μm and a diameter of 30×50 μm with a space between bumps of 12 μm and a glass substrate on which a wiring of a space of 12 μm is provided using the anisotropic conductive films in Examples and Comparative Examples under conditions of 180° C., 60 MPa, and 5 seconds, and the connection structure was obtained. For the obtained connection structure, an initial conduction resistance value was measured using a resistance measuring instrument (digital multimeter, Yokogawa Electric Corporation). The obtained result is shown in Table 1. 0.5Ω or less is desirable.

Conduction Reliability

The connection structure used in measurement of the initial conduction resistance value was input into an aging tester set to a temperature of 85° C. and a humidity of 85%, and the conductive resistance value after being left for 500 hours was measured in the same manner as the initial conduction resistance. The obtained result is shown in Table 1. 5Ω or less is desirable.

Conduction Failure Rate

The same connection structure as the connection structure used in measurement of the initial conduction resistance value was created and an conduction failure rate of the terminal was measured. The obtained result is shown in Table 1.

and furthermore, the anisotropic conductive film was created. For the obtained anisotropic conductive film, "non-presence" and "shift amount" of the electrically conductive particles were measured in the same manner as in Example 2, and furthermore, the particle area occupancy was calculated. As a result, the "non-presence" of the electrically conductive particles was the same as in Example 2. A result was obtained in which the "shift amount" also conforms to that in Example 2. In addition, the particle area occupancy was 0.5%.

In addition, the obtained anisotropic conductive film was interposed between a glass substrate (ITO solid de) and a flexible wiring board (bump width: 200 μm, L (line)/S (space)=1, wiring height 10 μm), anisotropic conduction was performed under the conditions of 180° C., 80 MPa, and 5 seconds such that a connection bump length is 1 mm, and the connection structure for evaluation was obtained. Concerning the "initial conduction resistance value" and the "conduction reliability" after being input for 500 hours in a thermostatic bath with a temperature of 85° C. and a humidity of 85% RH in the obtained connection structure, conduction resistance was measured using a four terminal method at a current of 1 A using a digital multimeter (34401A, manufactured by Agilent Technologies, Inc.), the "initial conduction resistance value" was evaluated as good in a case where a measurement value was 2Ω or less and failure in a case where the measurement value exceeds 2Ω, and the "conduction reliability" was evaluated as good in a case where a measurement value was 5Ω or less and failure

TABLE 1

|  |  | Examples | | | | Comparative Examples | |
| --- | --- | --- | --- | --- | --- | --- | --- |
|  |  | 1 | 2 | 3 | 4 | 1 | 2 |
| Transfer body master concave portion density | [number/mm²] | 16000 | 16000 | 28000 | 28000 | 16000 | 28000 |
| Electrically conductive particle average particle diameter | [μm] | 4 | 4 | 3 | 3 | 4 | 3 |
| Electrically conductive particle "non-presence" | [%] | 10.1 | 25 | 10.1 | 25 | 30 | 30 |
| Shift amount of electrically conductive particles | [μm] | 3.9 | 3.4 | 2.7 | 2.5 | 3.3 | 2.3 |
| Particle area occupancy | [%] | 18.1 | 15.1 | 17.8 | 14.8 | 14.1 | 13.8 |
| Initial conduction resistance | [Ω] | 0.3 | 0.35 | 0.35 | 0.4 | 1 | 1.3 |
| Conduction reliability | [Ω] | ≤4 | ≤4 | ≤4 | ≤4 | 5< | 5< |
| Conduction failure rate | [%] | 0 | 0 | 0 | 0 | 0.2 | 0.1 |

From the result in Table 1, for each evaluation item of initial conduction resistance, conduction reliability, and conduction failure rate, the connection structure in which the anisotropic conductive films in Examples 1 to 4 are used is understood to indicate a good result.

Meanwhile, in a case of the anisotropic conductive films in Comparative Examples 1 and 2, the proportion of "non-presence" of the electrically conductive particles was high, the initial conduction resistance value was greater than that in Examples, and the conduction failure rate was not 0%.

Example 5

In addition to adjusting the distance between the centers of adjacent concave portions to use the transfer body master in which the concave portion density was 500/mm², the transfer body was created in the same manner as Example 2, in a case where the measurement value was 5Ω or greater. As a result, every connection structure of the present Examples was evaluated as "good". In addition, when the "conduction failure rate" was measured in the same manner as Example 2, a good result was obtained in the same manner as Example 2.

Example 6

In addition to adjusting the distance between the centers of adjacent concave portions in order to use the transfer body master in which the concave portion density was 2000/mm², the transfer body was created in the same manner as Example 2, and furthermore, the anisotropic conductive film was created. For the obtained anisotropic conductive film, "non-presence" and "shift amount" of the electrically conductive particles were measured in the same manner as in Example 2, and furthermore, the particle area occupancy was calculated. As a result, "non-presence" of the electrically conductive particles was the same as in Example 2. A result was obtained in which the "shift amount" also conforms to that in Example 2. In addition, the particle area occupancy was 1.9%.

In addition, the connection structure for evaluation was obtained by performing anisotropic conductive connection with interposing the obtained anisotropic conductive film between the glass substrate and the flexible wiring board in the same manner as Example 5. When the obtained connection structure was evaluated for the "initial conduction resistance value", the "conduction reliability", and the "conduction failure rate" in the same manner as Example 5, good results were obtained for all of these.

Example 7

In addition to using the transfer body master in which the concave portion dimensions, the distance between the centers of adjacent concave portions, and the like were adjusted according to Example 1 such that the diameter of the electrically conductive particles from Example 1 is set from 4 μm to 10 μm and the concave portion density is set to 4400/mm², the transfer body was created in substantially the same manner as Example 1. Furthermore, other than modifying the electrically conductive particle diameter to 10 μm, the thickness of the electrically insulating adhesive base layer to 12 μm, and the thickness of the electrically insulating adhesive cover layer to 12 μm, the anisotropic conductive film was created in the same manner as in Example 1. For the obtained anisotropic conductive film, "non-presence" and "shift amount" of the electrically conductive particles were measured in the same manner as in Example 1, and furthermore, the particle area occupancy was calculated.

As a result, "non-presence" of the electrically conductive particles was the same as in Example 1. A result was obtained in which "shift amount" conforms to that in Example 1. The particle area occupancy was 30.7%.

In addition, the obtained anisotropic conductive film was interposed between a glass substrate (ITO solid electrode) and a flexible wiring board (bump width: 100 μm, L (line)/S (space)=1, wiring height 19 μm), anisotropic conduction was performed under the conditions of 180° C., 80 MPa, and 5 seconds such that a connection bump length is 1 mm, and the connection structure for evaluation was obtained. For the "initial conduction resistance value" and the "conduction reliability" after being input for 500 hours in a thermostatic bath with a temperature of 85° C. and a humidity of 85% RH in the obtained connection structure, conduction resistance was measured using a four terminal method at a current of 1 A using a digital multimeter (34401A, manufactured by Agilent Technologies, Inc.), the "initial conduction resistance value" was evaluated as good in a case where a measurement value was 2Ω or less and failure in a case where the measurement value exceeds 2Ω, and the "conduction reliability" was evaluated as good in a case where a measurement value was 5Ω or less and failure in a case where the measurement value was 5Ω or greater. As a result, every connection structure of the present Examples was evaluated as "good". In addition, when the "conduction failure rate" was measured in the same manner as Example 1, a good result was obtained in the same manner as Example 1.

INDUSTRIAL APPLICABILITY

In the anisotropic conductive film of the present invention, a proportion of "lattice points at which no electrically conductive particles are disposed" with respect to all lattice points with the planar lattice pattern assumed in any reference region is set to be 25% or less, and moreover, some of the electrically conductive particles disposed at the lattice points with the planar lattice pattern are disposed to be shifted in a longitudinal direction of the anisotropic conductive film with respect to corresponding lattice points, and the shift amount defined as a distance between a center of the electrically conductive particle disposed to be shifted and the corresponding lattice point is less than 50% of an average particle diameter of the electrically conductive particles. Therefore, in a case where the anisotropic conductive film of the present invention is applied to anisotropic conductive connection, it is possible to realize good initial conduction and good conduction reliability after aging, and it is also possible to suppress generation of shorts, therefore it is useful to performing anisotropic conductive connection of an IC chip and a wiring board with narrow pitches.

REFERENCE SIGNS LIST 10, 200 Anisotropic conductive film
11, 104 Electrically insulating adhesive base layer
12, 105 Electrically insulating adhesive cover layer
13, 103 Electrically conductive particle
100 Transfer body
101 Convex portion
102 Weak adhesive layer
A Position at which no electrically conductive particles are disposed at lattice points (position at which electrically conductive particles are not present)
B Electrically conductive particles disposed to be shifted in the longitudinal direction of anisotropic conductive film

The invention claimed is:

1. An anisotropic conductive film having a structure with an electrically insulating adhesive base layer and an electrically insulating adhesive cover layer being stacked, and electrically conductive particles being disposed at lattice points with a planar lattice pattern in the vicinity of an interface of the layers, wherein
　　a proportion of lattice points with no electrically conductive particles being disposed with respect to all lattice points with a planar lattice pattern assumed in any reference region of the anisotropic conductive film is 25% or less, and at least some external tangents of the electrically conductive particles being disposed in directions different from the longitudinal direction of the film so as not to coincide, and
　some of the electrically conductive particles disposed at the lattice points with the planar lattice pattern are disposed to be shifted in a longitudinal direction of the anisotropic conductive film with respect to corresponding lattice points, and a shift amount defined as a distance between a center of an electrically conductive particle disposed to be shifted and the corresponding lattice point is less than 50% of an average particle diameter of the electrically conductive particles.

2. An anisotropic conductive film having a structure in which electrically conductive particles are disposed at lattice points with a planar lattice pattern on an electrically insulating adhesive base layer, wherein
　　a proportion of lattice points with no electrically conductive particles being disposed with respect to all lattice points with a planar lattice pattern assumed in any reference region of the anisotropic conductive film is 25% or less, and at least some external tangents of the electrically conductive particles are disposed in directions different from the longitudinal direction of the film so as not to coincide, some of the electrically conductive particles disposed at the lattice points with the planar lattice pattern are disposed to be shifted in a longitudinal direction of the anisotropic conductive film with respect to corresponding lattice points, and a shift amount defined as a distance between a center of an electrically conductive particle disposed to be shifted and the corresponding lattice point is less than 50% of an average particle diameter of the electrically conductive particles.

3. The anisotropic conductive film according to claim 2, wherein the reference region is a square region including a side X and a side Y in a plane center portion of the anisotropic conductive film, the side X and the side Y satisfying the following relationships (A), (2), and (3):

$$100\ D \leq X+Y \leq 400\ D \qquad (A)$$

$$X \geq 5\ D \qquad (2)$$

$$Y \geq 5\ D \qquad (3)$$

wherein D is an average particle diameter of the electrically conductive particles, the side Y is a straight line in a range of less than ±45° with respect to the longitudinal direction of the anisotropic conductive film, and the side X is a straight line perpendicular to the side Y.

4. The anisotropic conductive film according to claim 2, wherein the reference region is a square region including a side X and a side Y in a plane center portion of the anisotropic conductive film, the side X and the side Y satisfying the following relationships (1) to (3):

$$X+Y=100\ D \qquad (1)$$

$$X \geq 5\ D \qquad (2)$$

$$Y \geq 5\ D \qquad (3)$$

wherein D is an average particle diameter of the electrically conductive particles, the side Y is a straight line in a range of less than ±45° with respect to the longitudinal direction of the anisotropic conductive film, and the side X is a straight line perpendicular to the side Y.

5. The anisotropic conductive film according to claim 2, wherein particle area occupancy of all electrically conductive particles being present in an area of any reference region of the anisotropic conductive film is 10 to 35% with respect to the area.

6. The anisotropic conductive film according to claim 2, wherein an average particle diameter of the electrically conductive particles is 1 to 10 μm, and a distance between adjacent lattice points with the planar lattice pattern is 0.5 times or greater the average particle diameter of the electrically conductive particles.

7. The anisotropic conductive film according to claim 2, wherein a maximum value of the shift amount of the electrically conductive particles disposed to be shifted in the longitudinal direction of the anisotropic conductive film with respect to the lattice points is larger than a shift amount in a direction orthogonal to the longitudinal direction.

8. The anisotropic conductive film according to claim 2, wherein the reference region is a substantially square region including a side X and a side Y in a plane center portion of the anisotropic conductive film, the side X and the side Y satisfying the following relationships:

$$X+Y=400\ D$$

$$X \geq 20\ D$$

$$Y \geq 20\ D$$

wherein D is an average particle diameter of the electrically conductive particles, the side Y is a straight line in a range of less than ±45° with respect to the longitudinal direction of the anisotropic conductive film, and the side X is a straight line perpendicular to the side Y.

9. The anisotropic conductive film according to claim 8, wherein particle area occupancy of all electrically conductive particles being present in an area of any reference region of the anisotropic conductive film is 0.15% or greater with respect to the area.

10. The anisotropic conductive film according to claim 8, wherein an average particle diameter of the electrically conductive particles is 1 to 30 μm, and a distance between adjacent lattice points with a planar lattice pattern is 0.5 times or greater the average particle diameter of the electrically conductive particles.

11. A manufacturing method of the anisotropic conductive film according to claim 2, the method comprising the steps (i) to (v):

step (i)
preparing a transfer body with a columnar convex portion equivalent to lattice points with a planar lattice pattern being formed on a surface;

step (ii)
setting at least a top surface of a convex portion of the transfer body as a weak adhesive layer;

step (iii)
adhering electrically conductive particles to the adhesive layer of the convex portion of the transfer body;

step (iv)
transferring the electrically conductive particles to an electrically insulating adhesive base layer by overlapping and pressing the electrically insulating adhesive base layer on a surface at a side of the transfer body with the electrically conductive particles being adhered; and step (v)
stacking an electrically insulating adhesive cover layer on the electrically insulating adhesive base layer with electrically conductive particles being transferred, from an electrically conductive particle transfer surface side.

12. The manufacturing method according to claim 11, wherein the transfer body to be used in step (i) is created by processing a metal plate to create a master, and then coating and curing a cured resin thereon.

13. The manufacturing method according to claim 11, wherein a height of the convex portion of the transfer body in step (i) is 2.5 times or greater to less than 5 times an average particle diameter of the electrically conductive particles, and a width of the convex portion is 0.6 times or greater to less than 1.3 times the average particle diameter of the electrically conductive particles.

14. A connection structure, wherein a terminal of a first electrical component and a terminal of a second electrical component are anisotropic-conductively connected using the anisotropic conductive film according to claim 2.

15. A manufacturing method of a connection structure, comprising anisotropic-conductively connecting a terminal of a first electrical component and a terminal of a second electrical component using the anisotropic conductive film according to claim 2.

16. The anisotropic conductive film according to claim 2, wherein the proportion is 10% to 25%.

* * * * *